(12) United States Patent
Upendran et al.

(10) Patent No.: US 10,297,007 B2
(45) Date of Patent: May 21, 2019

(54) MULTI-DIMENSIONAL MODEL DIMENSIONING AND SCALE ERROR CORRECTION

(71) Applicant: HOVER INC., San Francisco, CA (US)

(72) Inventors: Manish Upendran, San Francisco, CA (US); Adam J. Altman, San Francisco, CA (US); Derek Halliday, Oakland, CA (US)

(73) Assignee: HOVER INC., San Francisco, CA (US)

( * ) Notice: Subject to any disclaimer, the term of this patent is extended or adjusted under 35 U.S.C. 154(b) by 0 days.

(21) Appl. No.: 15/817,755

(22) Filed: Nov. 20, 2017

(65) Prior Publication Data
US 2018/0089797 A1 Mar. 29, 2018

Related U.S. Application Data

(63) Continuation of application No. 15/400,718, filed on Jan. 6, 2017, now Pat. No. 9,830,681, which is a
(Continued)

(51) Int. Cl.
*G06T 3/40* (2006.01)
*G06K 9/62* (2006.01)
(Continued)

(52) U.S. Cl.
CPC ............ *G06T 3/40* (2013.01); *G06F 16/283* (2019.01); *G06F 16/583* (2019.01); *G06F 17/50* (2013.01);
(Continued)

(58) Field of Classification Search
CPC ..... G06T 7/11; G06T 7/12; G06T 7/13; G06T 7/10–19; G06T 3/40
See application file for complete search history.

(56) References Cited

U.S. PATENT DOCUMENTS 5,973,697 A  10/1999  Berry et al.
6,370,261 B1 *  4/2002  Hanawa ............... G01S 13/931
                                           382/104
(Continued)

FOREIGN PATENT DOCUMENTS

WO   WO2007147830 A1   12/2007
WO   WO2011079241 A1    6/2011
WO   WO2011091552 A1    8/2011

OTHER PUBLICATIONS

Ou et al., "A new method for automatic large scale map updating using mobile mapping imagery", Sep. 2013, Wiley Online Library, vol. 28, No. 143, pp. 240-260.*
(Continued)

*Primary Examiner* — Mark K Zimmerman
*Assistant Examiner* — Jonathan M Cofino
(74) *Attorney, Agent, or Firm* — Garlick & Markison; Randy W. Lacasse

(57) ABSTRACT

A system and method are provided for identifying scale, scale error, or improper positioning during construction or reconstruction of a multi-dimensional (e.g., 3D) building model using known architectural dimensions. The system identifies architectural elements that have known architectural standard positions relative to planes within the multi-dimensional model. Dimensional measurements of architectural elements in the multi-dimensional model (poorly scaled) are compared with known architectural standard dimensions, with or without scale error, to properly scale, rescale or position one or more planes within the multi-dimensional building model.

9 Claims, 12 Drawing Sheets

Related U.S. Application Data continuation-in-part of application No. 15/332,481, filed on Oct. 24, 2016, now Pat. No. 9,830,742, which is a continuation of application No. 14/610,850, filed on Jan. 30, 2015, now Pat. No. 9,478,031.

(60) Provisional application No. 61/934,541, filed on Jan. 31, 2014.

(51) Int. Cl.

| | |
|---|---|
| *G06T 17/05* | (2011.01) |
| *G06T 19/20* | (2011.01) |
| *G06F 16/28* | (2019.01) |
| *G06F 16/583* | (2019.01) |
| *G06T 7/12* | (2017.01) |
| *G06F 17/50* | (2006.01) |

(52) U.S. Cl.
CPC ............. *G06K 9/6267* (2013.01); *G06T 7/12* (2017.01); *G06T 17/05* (2013.01); *G06T 19/20* (2013.01); *G06T 2200/04* (2013.01); *G06T 2207/30184* (2013.01); *G06T 2210/04* (2013.01); *G06T 2219/2016* (2013.01)

(56) References Cited

U.S. PATENT DOCUMENTS

| | | | |
|---|---|---|---|
| 7,218,318 | B2 | 5/2007 | Shimazu |
| 7,814,436 | B2 | 10/2010 | Schrag et al. |
| 8,040,343 | B2 | 10/2011 | Kikuchi et al. |
| 8,098,899 | B2 | 1/2012 | Ohashi |
| 8,139,111 | B2 | 3/2012 | Oldroyd |
| 8,339,394 | B1 | 12/2012 | Lininger |
| 8,346,578 | B1 * | 1/2013 | Hopkins, III .......... G06Q 40/00 382/100 |
| 8,350,850 | B2 | 1/2013 | Steedly et al. |
| 8,390,617 | B1 | 3/2013 | Reinhardt |
| 9,478,031 | B2 | 10/2016 | Bhatawadekar et al. |
| 2003/0014224 | A1 | 1/2003 | Guo et al. |
| 2003/0052896 | A1 | 3/2003 | Higgins et al. |
| 2004/0196282 | A1 | 10/2004 | Oh |
| 2007/0168153 | A1 | 7/2007 | Minor et al. |
| 2008/0221843 | A1 | 9/2008 | Shenkar et al. |
| 2009/0043504 | A1 | 2/2009 | Bandyopadhyay et al. |
| 2010/0045869 | A1 | 2/2010 | Baseley et al. |
| 2010/0074532 | A1 | 3/2010 | Gordon et al. |
| 2010/0114537 | A1 | 5/2010 | Pershing |
| 2011/0029897 | A1 | 2/2011 | Russell |
| 2011/0181589 | A1 | 7/2011 | Quan et al. |
| 2012/0182392 | A1 | 7/2012 | Kearns et al. |
| 2012/0224770 | A1 | 9/2012 | Strassenburg-Kleciak |
| 2013/0195362 | A1 | 8/2013 | Janky et al. |
| 2013/0257850 | A1 | 10/2013 | Chen et al. |
| 2014/0153773 | A1 * | 6/2014 | Gupta .................. G06K 9/6202 382/103 |
| 2014/0212028 | A1 | 7/2014 | Ciarcia |
| 2015/0086084 | A1 | 3/2015 | Falconer et al. |
| 2016/0350969 | A1 | 12/2016 | Castillo et al. |

OTHER PUBLICATIONS

Vosselman et al., "3D building model reconstruction from point clouds and ground plans", Oct. 2001, Natural Resources Canada, vol. 34, No. 3/W4, pp. 37-44.*

Sithole; "Detection of Bricks in a Masonry Wall"; The International Archives of the Photogrammetry, Remote Sensing and Spatial Information Sciences; vol. 37, Part B5; pp. 567-571 (Year: 2008).*

Abdul Hasanulhakeem1; A tool to measure dimensions of buildings in various scales for Google Earth Plug-ins and 3D maps; Aug. 6, 2010; pp. 1-2 downloaded from internet: [https://groups.google.com/forum/#!topic/google-earth-browser-plugin/frlvZQ-m38I].

Bansal, et al., "Geo-Localization of Street Views with Aerial Image Databases," Nov. 28-Dec. 1, 2011, pp. 1125-1128.

Becker, et al., "Semiautomatic 3-D model extraction from uncalibrated 2-D camera views," MIT Media Laboratory, 15 pages, Published: Apr. 7, 1995.

Chen, et al., "City-Scale Landmark Identification on Mobile Devices," pp. 737-744, Published in 2011.

Fairfax County Virginia, "Virtual Fairfax," http://www.fairfaxcounty.gov/gis/virtualfairfax, Feb. 24, 2014, 2 pages.

Fruh and Zakhor, "Constructing 3D City Models by Merging Aerial and Ground Views," IEEE Computer Graphics and Applications, Nov./Dec. 2003, pp. 52-61, 10 pages.

Huang and Wu, et al., "Towards 3D City Modeling through Combining Ground Level Panoramic and Orthogonal Aerial Imagery," 2011 Workshop on Digital Media and Digital Content Management, pp. 66-71, 6 pages.

Jaynes, "View Alignment of Aerial and Terrestrial Imagery in Urban Environments," Springer-Verlag Berlin Heidelberg 1999, pp. 3-19, 17 pages.

Kroepfl, et al., "Efficiently Locating Photographs in Many Panoramas," Nov. 2-5, 2010, ACM GIS'10.

Lee, et al., "Automatic Integration of Facade Textures into 3D Building Models with a Projective Geometry Based Line Clustering," Eurographics 2002, vol. 2, No. 3, 10 pages.

Lee, et al., "Integrating Ground and Aerial Views for Urban Site Modeling," 2002, 6 pages.

Pu et al., "Automatic Extraction of Building Features From Terrestrial Laser Scanning," International Institute for Geo-Information Science and Earth Observation, 5 pages, Published: Sep. 2006.

Scale & Area Measurement; http://www.geog.ucsb.edu/~jeff/115a/lectures/scale_and_area_measurement.html, 8 pages, Accessed: Feb. 24, 2014.

Scope Technologies; Solutions; Mar. 4, 2014; pp. 1-2 downloaded from the internet: [http://www.myscopetech.com/solutions.php].

SketchUp Knowledge Base, Tape Measure Tool: Scaling an entire model, http://help.sketchup.com/en/article/95006, 2013 Trimble Navigation Limited, 2 pages.

Wang, et al.; Large-Scale Urban Modeling by Combining Ground Level Panoramic and Aerial Imagery; IEEE Third International Symposium on 3D Data Processing, Visualization, and Transmission; Jun. 14-16, 2006; pp. 806-813.

Xiao, et al., "Image-based Facade Modeling," ACM Transaction on Graphics (TOG), 2008, 10 pages.

* cited by examiner

MULTI-DIMENSIONAL MODEL DIMENSIONING AND SCALE ERROR CORRECTION

CROSS REFERENCE TO RELATED PATENTS/PATENT APPLICATIONS

The present U.S. Utility patent application claims priority pursuant to 35 U.S.C. § 120 as a continuation of U.S. Utility application Ser. No. 15/400,718, entitled "MULTI-DIMENSIONAL MODEL DIMENSIONING AND SCALE ERROR CORRECTION," filed Jan. 6, 2017, which is a continuation-in-part of U.S. Utility application Ser. No. 15/332,481, entitled "SCALE ERROR CORRECTION IN A MULTI-DIMENSIONAL MODEL," filed Oct. 24, 2016, which is a continuation of U.S. Utility application Ser. No. 14/610,850, entitled "SCALE ERROR CORRECTION IN A MULTI-DIMENSIONAL MODEL," filed Jan. 30, 2015, issued as U.S. Pat. No. 9,478,031 on Oct. 25, 2016, which claims priority pursuant to 35 U.S.C. § 119(e) to U.S. Provisional Application No. 61/934,541, entitled "SCALE ERROR CORRECTION IN A GEO-REFERENCED THREE-DIMENSIONAL (3D) MODEL," filed Jan. 31, 2014, all of which are hereby incorporated herein by reference in their entirety and made part of the present U.S. Utility patent application for all purposes.

This application makes reference to the complete subject matter of U.S. Utility patent application Ser. No. 13/624,816 entitled "THREE-DIMENSIONAL MAP SYSTEM" filed Sep. 21, 2012, issued as U.S. Pat. No. 8,878,865 on Nov. 4, 2014, and U.S. patent application Ser. No. 12/265,656 entitled "METHOD AND SYSTEM FOR GEOMETRY EXTRACTION, 3D VISUALIZATION AND ANALYSIS USING ARBITRARY OBLIQUE IMAGERY" filed Nov. 5, 2008, issued as U.S. Pat. No. 8,422,825 on Apr. 16, 2013, both of which are incorporated herein by reference in their entirety.

BACKGROUND

Technical Field

The technology described herein relates generally to a system and method for scaling and/or correcting scale errors in a multi-dimensional (e.g., 3D) model, and in particular to a system and method for scaling and constructing and/or rescaling and reconstructing a multi-dimensional model using known architectural standards.

Description of Related Art

Location-based technologies and mobile technologies are often considered the center of the technology revolution of this century. Essential to these technologies is a way to best present location-based information to devices, particularly mobile devices. The technology used to represent this information has traditionally been based on a two-dimensional (2D) map. Some efforts have been made to generate three-dimensional (3D) maps of urban cities with accurate 3D textured models of the buildings via aerial imagery or specialized camera-equipped vehicles. However, these 3D maps have limited texture resolution, geometry quality, inaccurate scaling and are expensive, time consuming and difficult to update and provide no robust real-time image data analytics for various consumer and commercial use cases.

DETAILED DESCRIPTION

Figure 1:
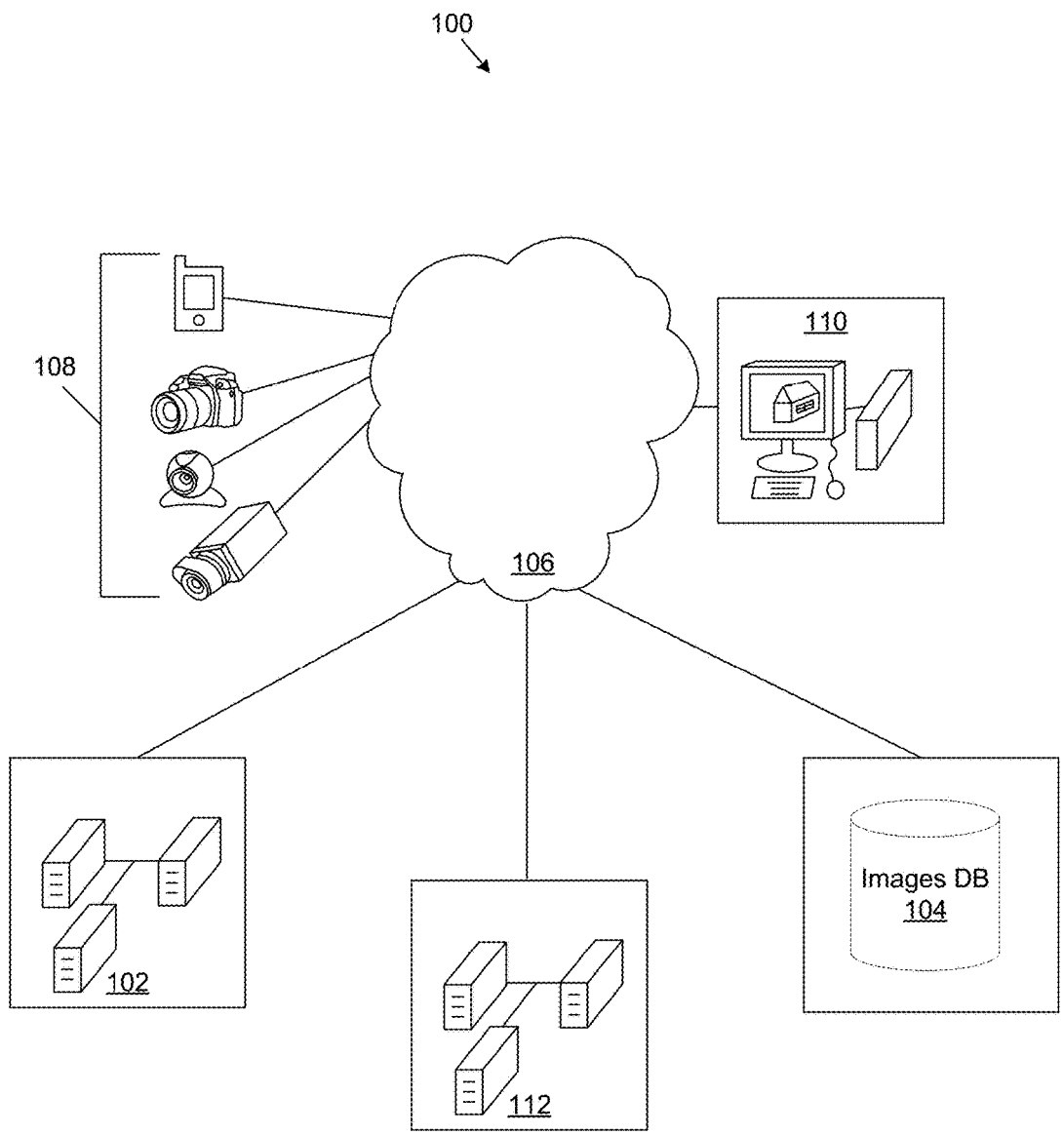
FIG. 1 illustrates one embodiment of a system architecture in accordance with the present disclosure.

FIG. 1 illustrates one embodiment of system architecture in accordance with the present disclosure. In one embodiment, image processing system 100 includes image processing servers 102. Image database (DB) 104 and image processing servers 102 are coupled via a network channel 106.

The network channel 106 is a system for communication. Network channel 106 includes, for example, an Ethernet or other wire-based network or a wireless NIC (WNIC) or wireless adapter for communicating with a wireless network, such as a WI-FI network. In other embodiments, the network channel 106 includes any suitable network for any suitable communication interface. As an example, and not by way of limitation, the network channel 106 can include an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As another example, the network channel 106 can be a wireless PAN (WPAN) (such as, for example, a BLUETOOTH WPAN), a WI-FI network, a WI-MAX network, a 3G or 4G network, a cellular telephone network (such as, for example, a Global System for Mobile Communications (GSM) network).

In one embodiment, the network channel 106 uses standard communications technologies and/or protocols. Thus, the network channel 106 can include links using technologies such as Ethernet, 802.11, worldwide interoperability for microwave access (WiMAX), 3G, 4G, CDMA, digital subscriber line (DSL), etc. Similarly, the networking protocols used on the network channel 106 can include multiprotocol label switching (MPLS), the transmission control protocol/ Internet protocol (TCP/IP), the User Datagram Protocol (UDP), the hypertext transport protocol (HTTP), the simple mail transfer protocol (SMTP), and the file transfer protocol (FTP). In one embodiment, the data exchanged over the network channel 106 is represented using technologies and/ or formats including the hypertext markup language (HTML) and the extensible markup language (XML). In addition, all or some of links can be encrypted using conventional encryption technologies such as secure sockets layer (SSL), transport layer security (TLS), and Internet Protocol security (IPsec).

In one or more embodiments, the image processing servers 102 include suitable hardware/software in the form of circuitry, logic gates, and/or code functions to process digital images to include, but not limited to, calculation of one or more image measurements according to an architectural feature measurement located within the images themselves. Capture device(s) 108 is in communication with image processing servers 102 for collecting digital images of building objects. Capture devices 108 are defined as digital devices for capturing images. For example, the capture devices include, but are not limited to: a camera, a phone, a smartphone, a tablet, a video camera, a security camera, a closed-circuit television camera, a computer, a laptop, a webcam, wearable camera devices, photosensitive sensors, drone mounted imaging devices, equivalents or any combination thereof.

Image processing system 100 also provides for viewer device 110 that is defined as a display device. For example, viewer device 110 can be a computer with a monitor, a laptop, a smartphone, a tablet, a touch screen display, an LED array, a television set, a projector display, a wearable heads-up display of some sort, a remote display associate with a camera device, or any combination thereof. In one or more embodiments, the viewer device includes display of one or more building facades and associated measurements, such as, for example, a mobile device, a conventional desktop personal computer having input devices such as a mouse, keyboard, joystick, or other such input devices enabling the input of data and interaction with the displayed images and associated measurements.

In one embodiment, ground-level images of a physical building are uploaded to image processing system 100 from a capture device. An uploaded image is, for example, a digital photograph of a physical building showing a façade (side) of the physical building. Image processing system 100 is used to generate accurately textured, 2D/3D building models based on the collected digital images. The textured, 2D/3D building models are generated using systems and methods, for example, as provided in U.S. Pat. Nos. 8,878, 865, and 8,422,825, and hereby incorporated by reference. In addition, third party sources of textured models can be substituted in the various embodiments described herein without departing from the scope of the technology described.

However, orthogonal/oblique imagery typically used for geo-referencing is inherently inaccurate and/or of low resolution resulting in scaled 2D/3D models that are not accurate enough to extrapolate precise dimensions. For example, a scaled 3D model can be used to calculate dimensions for building materials (i.e., siding for an exterior wall, exterior brick, a door, etc.) in a construction project. Using an orthogonally geo-referenced 3D model, the calculated dimensions are likely to include error given the low resolution and potential for visibility errors (e.g., occlusions).

It is known that some architectural elements used in the construction industry are standardized. For example, rows of siding applied to exterior walls are typically separated by 6-10 inches (depending on the type of siding and location). However, it is understood that other dimensions exist and that the technology described herein is not limited to the specific dimensions provided in example embodiments.

In one or more embodiments of the technology described herein, a system and method are provided for dimensioning and/or correcting error in an untextured/textured multi-dimensional building model. Images of a multi-dimensional building model are used to identify scale and/or scale error by comparing to known architectural dimensions. Once scale or scale error is identified, the textured models are reconstructed with accurately scaled multi-dimensional building models. Throughout the descriptions and example embodiments that follow, a measurement of one or more known architectural elements can be used to scale one or more image planes of a multi-dimensional model while it is being constructed or after construction is completed. In addition, scale errors can be determined based on one or more known architectural elements and used to rescale one or more image planes of the multi-dimensional model.

Figure 2:
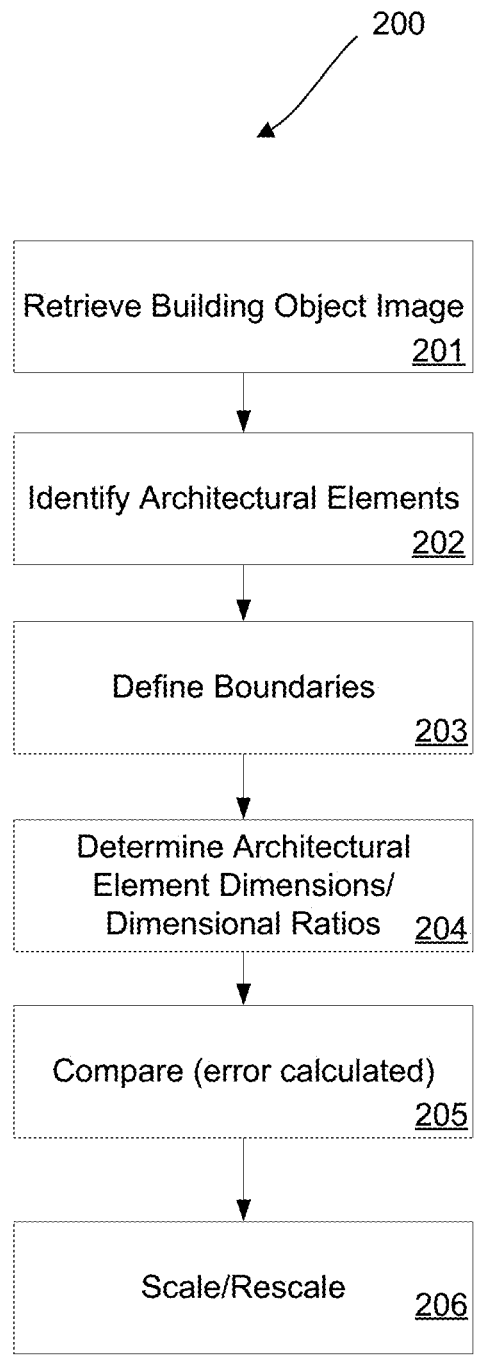
FIG. 2 illustrates a flowchart representing one embodiment of a process for accurately rescaling a multi-dimensional building model in accordance with the present disclosure.

FIG. 2 illustrates a flowchart representing one embodiment process for accurately scaling/rescaling a textured multi-dimensional building model in accordance with the present disclosure. In step 201, at least one digital image is retrieved (e.g., image associated with building object). In one embodiment, only a portion of the digital image is retrieved since the entire image (façade) may not be needed for scaling/scale error corrections. This portion, for example front façade, may include a cut-out of a full 2D image that has been rectified and correlated to vertices of geometric planes/polygons that make up a portion of a 3D model. For example, the portion may be a close up of the front porch of a house that includes the front door. In step 202, known architectural elements of the digital image are identified. In one embodiment, architectural elements are identified using known image or object recognition techniques, including those techniques of the US references incorporated herein by reference. In alternative embodiments, the identification of architectural elements is accomplished using other approaches. For example, the boundaries for rows of siding are automatically identified using line detection techniques (e.g., frequency domain filtering). In step 203, boundaries (i.e., siding, bricks, etc.) are identified (defined) using unique feature detection methods that look for repeated patterns, such as, consistent parallel lines or line intersections. For yet another example, boundaries for architectural elements are detected using unsupervised clustering algorithms based on learned, predictable patterns. For yet another example, boundaries can be manually marked up (e.g., by human observer).

A measurement (e.g., dimensional ratios) of the architectural element is conducted in step 204 using image processing system 100 of FIG. 1. In one embodiment, siding rows are used as the known architectural element and the distance between siding rows (top boundary and bottom boundary) is measured in the multi-dimensional model. Pixels defining the boundaries of the architectural elements are identified within the multi-dimensional building model. In one embodiment, a plurality of measurements is conducted to determine an average measurement between pixels representing the boundaries of a siding row. In one embodiment, a plurality of measurements is conducted to determine an average measurement between pixels representing the boundaries of a siding row.

The calculated average measurement value of the known architectural element is compared to a threshold measurement (measurement including +−threshold error) according to known architectural standard dimensions in step 205. The threshold measurement accounts for the inherent inaccuracy of the imagery (scale error) and provides a likely range of values that are used to correlate the average measurement value to an actual measurement value (real dimensions based on known architectural standard dimensions). For example, if the known architectural standard dimensions for a solar panel is 10×10 (feet), the threshold will be established using, for example, +/−10% of the 10 feet (or up to 1 ft) in both directions (x and y). If the average measurement falls within the threshold measurement, it is assumed that the average measurement is likely to be the known architectural standard dimension. If the average measurement fails to fall within the threshold measurement, it is assumed that it does not apply to the known architectural standard or it is from a different standard dimension (i.e., 5×5, 15×15, etc.).

In one embodiment, the known architectural standard dimension is a distance between rows of siding on the façade of a building. As previously discussed, the boundaries (top and bottom edges) for rows of siding applied to exterior walls of a building object are frequently separated by 6-10 inches (depending on the type of siding). In one embodiment, a digital image having siding exposed on at least one exterior wall is provided that corresponds to a textured façade of a multi-dimensional building model. Image processing system 100 of FIG. 1 identifies the exterior siding using known computer vision techniques, defines the boundaries of the siding rows, correlates the pixels to the defined boundaries and measures the distance between the boundary defining pixels of adjacent rows. In one embodiment, the distance between the boundaries is measured in a plurality of locations on the exterior wall to create an average measurement value. In one or more embodiments, dimensional ratios are used to determine proper scaling.

The average measurement value of the boundaries between the rows of siding is compared to known architectural standard dimensions of, for example, 6 inches, 7 inches, 8 inches, etc. separating each row from an adjacent row. For example, an average measurement of 6.63 inches indicates ambiguity whether it is actually 6 inches (would represent approximately 10.5% error) or 7 inches (would represent approximately 5.3% error) as the architectural dimension standards indicate. In one embodiment, the average measurement falls within a given threshold range of +/−10% (inherent orthogonal imagery error).

As previously discussed, an average measurement value of 6.63 inches is indicative that the siding may represent either the 6 inch or 7 inch architectural standard dimension. To determine actual dimensions, the average measurement value is compared to the threshold ranges for both 6 inches and 7 inches. In order for the 6.63 inch average measurement to be correlated to an actual measurement of 6 inches, the average measurement would have to fall between 5.4 inches and 6.6 inches (0.6 inches=10%). The average measurement of 6.63 (i.e., 10.5%) is outside of the threshold and, therefore, the rows of siding are not correlated to a 6 inch distance between rows. While described using a +/−10% threshold, other thresholds are envisioned without departing from the scope of the technology described herein.

In the same example, in order for the average measurement to be correlated to an actual measurement of 7 inches, the average measurement would have to fall between the threshold range of 6.3 inches and 7.7 inches. The average measurement of 6.63 inches (i.e., 5.3%) falls between the threshold so it is determined that the distance between rows of siding has high likelihood of an actual value of 7 inches.

In another embodiment, a door is used as the known architectural standard dimension. There are various sizes of doors used in the construction industry (e.g., single doors, French doors, etc.). In one example, a typical door size may be 30×80 (i.e., 30 inches wide by 80 inches high). It is understood by those skilled in the art that the technology described here includes, but is not limited to, commonly used door sizes (e.g., the most common widths are 28, 30 and 32 inches; typically, around 80 inches.)

Using the process described above, a corresponding digital image is used to identify the door as an architectural element on at least one façade of the building model. In one embodiment, an average measurement of the width and the height is determined and compared to the threshold. In one embodiment, a width-to-height ratio or height-to-width ratio of the architectural element is determined and compared to a known ratio, including error threshold. In another embodiment, the total area of the door is determined and used as the average measurement value. Using the comparison of the average measurement to the measurement with threshold error, the actual door size is determined based on the known door standard dimensions.

In yet another embodiment, bricks sizes are used as the known architectural standard dimensions. There are various sizes of bricks used in the construction industry (e.g., standard, modular, Norman, Roman, jumbo, etc.). The size of the brick is used to extrapolate a wall size and identify error in a multi-dimensioned building model. For example, a typical brick dimension is 3½×2¼×8 (depth (D)×height (H)×length (L) in inches). However, it is understood by those skilled in the art that the technology described here includes, but is not limited to, other commonly used bricks dimensions listed in Table 1.

TABLE 1

| brick types and standard dimensions. | |
|---|---|
| Brick Type | Actual Size D × H × L (inches) |
| Modular | 3½ × 2¼ × 7½ |
| Norman | 3½ × 2¼ × 11½ |
| Roman | 3½ × 1¼ × 11½ |
| Jumbo | 3½ × 2½ × 8 |
| Economy | 3½ × 3½ × 7½ |
| Engineer | 3½ × 2¾ × 7½ |
| King | 3 × 2¾ × 9¾ |
| Queen | 3 × 2¾ × 8 |
| Utility | 3½ × 3½ × 11½ |

In a similar process to the previously discussed embodiment of using siding rows as the known architectural standard dimension, brick height and width is used to identify error in the building model. An average measurement of a distance between rows of bricks (from the bottom of one brick to the bottom of the brick above including or, optionally, excluding mortar) is compared to known architectural standard dimensions separating each row from a subsequent row. An average measurement value of the multi-dimensional building model's brick façade is determined and compared to the measurements, including threshold error values, for known architectural dimensions separating the brick rows. Threshold values are established for each of the brick types and the comparison is made between the average measurement value and the known architectural standard dimension+−threshold error. In other embodiments, a brick's width or width and height, width-to-height, or height-to-width ratio is compared against known dimensional architectural standards (with or without error thresholds).

In step 206, the determined actual dimension of a known architectural element is used to scale/rescale and reconstruct the multi-dimensional (2D/3D) building model. In one embodiment, an untextured, building model is scaled/resealed using one of the vertices as an anchor point. For example, once a known architectural measurement is determined (e.g., based on 30:80 (3:8) ratio of front door), that scale (30 inches for width of door and 80 inches for height of door) is used for a corresponding door image measurement and thereafter is used to scale one or more image planes of the multi-dimensional model. In a rescaling example, if the actual dimension determines that building model contains 10% error (too large), a vertex is used as an anchor point and the length of one of the lines/edges corresponding to the vertex is reduced by 10%. Once the edge has an accurate dimension, the vertex is anchored (i.e., anchored in a real-world position). The dimensions and position of the remaining vertices and edges are adjusted accordingly to maintain the original geometry (angles of the vertices) of the building model. In another embodiment, a centroid (the geometric center of the building model) is used as an anchor point and the dimensions of the vertices and edges are adjusted accordingly. Once a scaled/resealed building model has been constructed/reconstructed, the building model is textured based on the digital images with the original digital images used for textures.

Figure 3:
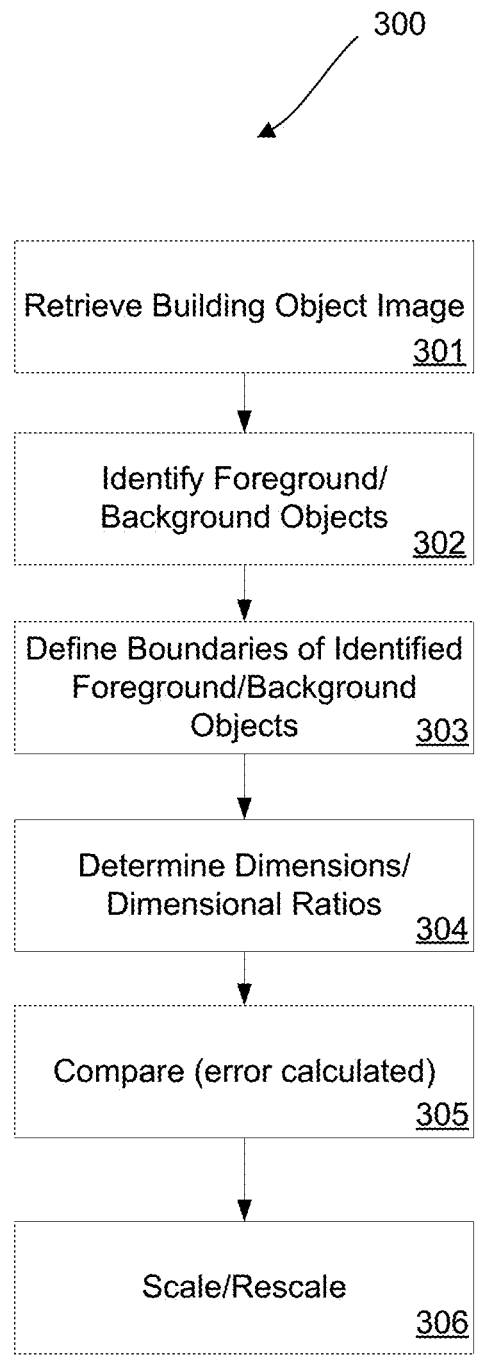
FIG. 3 illustrates a flowchart representing another embodiment of a process for accurately scaling/rescaling a multi-dimensional building model in accordance with the present disclosure.

FIG. 3 illustrates a flowchart representing another embodiment of a process for accurately scaling/rescaling a multi-dimensional building model in accordance with the present disclosure. For example, a random object in a field-of-view (e.g., foreground/background) during imaging of a subject building object is used to properly dimension (scale) one or more planes within a multi-dimensional model of the building object.

In step 301, at least one digital image is retrieved (e.g., image associated with building object). For example, the digital image may be an image of a house that includes the front yard surrounding a front façade of the house that is the subject of the multi-dimensional building model.

In step 302, foreground/background objects in a field of view of the building object are identified. In one embodiment, foreground/background objects are identified using known image or object recognition techniques, including those techniques of the US references incorporated herein by reference. In alternative embodiments, the identification of foreground/background objects is accomplished using other approaches. For example, parked automobiles, light fixtures, lamp posts, telephone poles, stop signs, play structures, tables, chairs, or lawn equipment are automatically identified using image recognition techniques. In step 303, boundaries of these foreground/background objects are identified using unique feature detection methods that look for repeated patterns, such as, consistent parallel lines or line intersections. For yet another example, boundaries for foreground/background objects are detected using unsupervised clustering algorithms based on learned, predictable patterns. For yet another example, boundaries can be manually marked up (e.g., by human observer).

A measurement (e.g., dimensional ratio) of the foreground/background object is conducted in step 304 using image processing system 100 of FIG. 1. In one example embodiment, telephone poles within the digital image are used as the known foreground/background object and the known dimensional ratio (e.g., ratio of height-to-width) of a standard telephone pole is used to scale/rescale (step 306) one or more image planes of the associated multi-dimensional building model. In one embodiment, a plurality of telephone pole ratios located within the image is averaged to determine an average ratio of a plurality of telephone poles. In addition, a distance from the pole to a plane of the building (house) is used to geometrically calculate a relative measurement relationship using known geometric image processing methods.

The calculated average ratio value of the known foreground/background objects is compared to a threshold ratio (ratio with threshold error) according to known standard dimensions in step 305. The threshold measurement accounts for the inherent inaccuracy of the imagery (scale error) and provides a likely range of values that are used to correlate the average ratio value to an actual ratio value (real dimensions based on known standard dimensions). For example, if the known standard height for a class 6 telephone pole in the United States is about 40 ft. (12 m) long and it is buried about 6 ft. (2 m) in the ground, 34 ft. will be used for a standard height, the threshold will be established using, for example, +/−10% of the 34 feet (or up to 3.4 ft.). The minimum width for a class 6, 40 foot pole is 9.07 inches measured at six feet from the butt end. Therefore, the width threshold will be established using, for example, +/−10% of the 9.07 inches (or up to 0.907 inches). If the average ratio falls within the threshold, it is assumed that the average measurement is likely to be the known standard dimension. If the average measurement fails to fall within the threshold, it is assumed that it does not apply to the known standard or it is from a different standard dimension (i.e., 50 ft, 60 ft, class 7, class 8, etc.).

In one embodiment, a width-to-height ratio or height-to-width ratio of the foreground/background object is determined and compared to a known threshold ratio. In another embodiment, the total area of the object is determined and used as the average measurement value. Using the comparison of the average measurement to the threshold measurement, the actual object is determined based on the known standard dimensions.

In step 306, the determined actual dimension of a known architectural element is used to scale/rescale and reconstruct the multi-dimensional (2D/3D) building model. In one embodiment, an untextured, building model is scaled/rescaled using one of the vertices as an anchor point. For example, once a known measurement is determined, that scale (e.g., 34 feet) is used for a corresponding telephone pole image measurement and thereafter is used to scale one or more image planes of the multi-dimensional model (as corrected based on distance from plane). In a rescaling example, if the actual dimension determines that the multi-dimensional building model contains 10% error (too large), a vertex is used as an anchor point and the length of one of the lines/edges corresponding to the vertex is reduced by 10%. Once the edge has an accurate dimension, the vertex is anchored (i.e., anchored in a real-world position). The dimensions and position of the remaining vertices and edges are adjusted accordingly to maintain the original geometry (angles of the vertices) of the building model. In another embodiment, a centroid (the geometric center of the building model) is used as an anchor point and the dimensions of the vertices and edges are adjusted accordingly. Once a scaled/rescaled building model has been constructed/reconstructed, the building model is textured based on the digital images with the original digital images used for textures.

Figure 4:
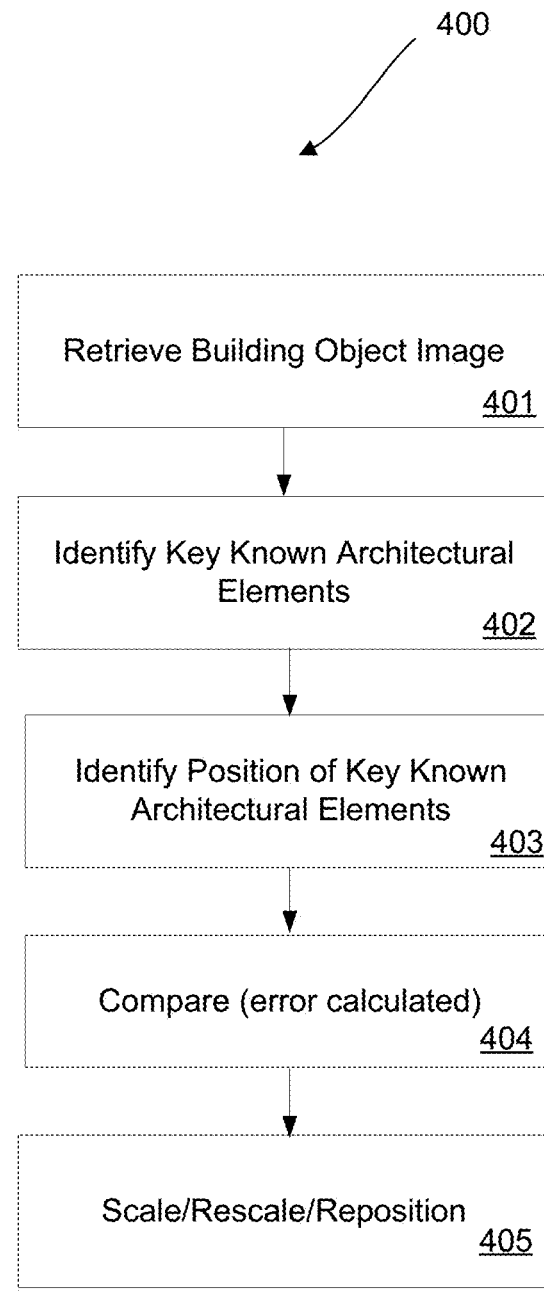
FIG. 4 illustrates a flowchart representing one embodiment of a process for accurately scaling/rescaling/repositioning one or more planes of a multi-dimensional building model in accordance with the present disclosure.

FIG. 4 illustrates a flowchart representing one embodiment of a process for accurately scaling/rescaling/repositioning one or more planes of a multi-dimensional building model in accordance with the present disclosure. Sometimes, errors in positioning of various image planes within a multi-dimensional model occur due to skew, obfuscation (i.e., hidden planes), or missing images of the subject plane. However, if key known architectural features within the multi-dimensional model can be identified, the model can be corrected by properly scaling/rescaling or moving selected planes (e.g., walls) to correct positions based on known relationships between the key known architectural features and associated planes in the multi-dimensional building model. For example, downspouts always follow an exterior wall edge. If the downspouts can be properly identified, proper placement of associated wall planes can be improved. In another example embodiment, gables are symmetrical and therefore walls supporting the gables should also be positioned symmetrically (e.g., equidistant from the center of the gable). Therefore, if one half of a symmetrical architectural feature is properly identified and dimensioned, for example, one side of a gable, everything is known to draw the other side of the gable. Once known, the dimensions of the gable can be used to properly size other architectural features, for example, a garage door under the gable.

In step 401, at least one digital image is retrieved (e.g., image associated with building object). For example, the digital image may be an image of a front building facade. In one embodiment, only a portion of the digital image is retrieved since the entire image (façade) may not be needed for scaling/scale error/plane positioning corrections. This portion, for example front façade, may include a cut-out of a full 2D image that has been rectified and correlated to vertices of geometric planes/polygons that make up a portion of a 3D model. For example, the portion may be a close up of the outside wall edge of a house that includes a downspout.

In step 402, key known architectural elements are identified. In one embodiment, architectural elements are identified using known image or object recognition techniques, including those techniques of the US references incorporated herein by reference. In alternative embodiments, the identification of architectural elements is accomplished using other approaches. For example, downspouts are automatically identified using line detection techniques (e.g., frequency domain filtering) or using unique feature detection methods that look for repeated patterns, such as, consistent parallel lines or line intersections. For yet another example, key known architectural elements are detected using unsupervised clustering algorithms based on learned, predictable patterns. For yet another example, key known architectural elements can be manually marked up (e.g., by human observer).

An identification of the position (included boundaries) of the key known architectural element is conducted in step 403 using image processing system 100 of FIG. 1. In one embodiment (see FIG. 9 and associated discussion), downspouts are used as the key known architectural element.

In step 404, the position of the known architectural element (e.g., at least an inside edge (nearest exterior of wall plane)) is compared to a position of an exterior wall plane associated with the downspout. The comparison accounts for the inherent inaccuracy of the imagery and provides a likely position of the exterior wall plane (based on a known relationship between the downspout and the exterior wall plane), juxtaposed with the downspout (adjusting for a predetermined/calculated known gap between downspout and wall).

In step 405, the determined actual positioning of the key known architectural element is used to scale/rescale/reposition image planes and reconstruct the multi-dimensional (2D/3D) building model. Once a scaled/rescaled/repositioned plane building model has been constructed/reconstructed, the building model is textured based on the digital images with the original digital images used for textures.

Figure 5:
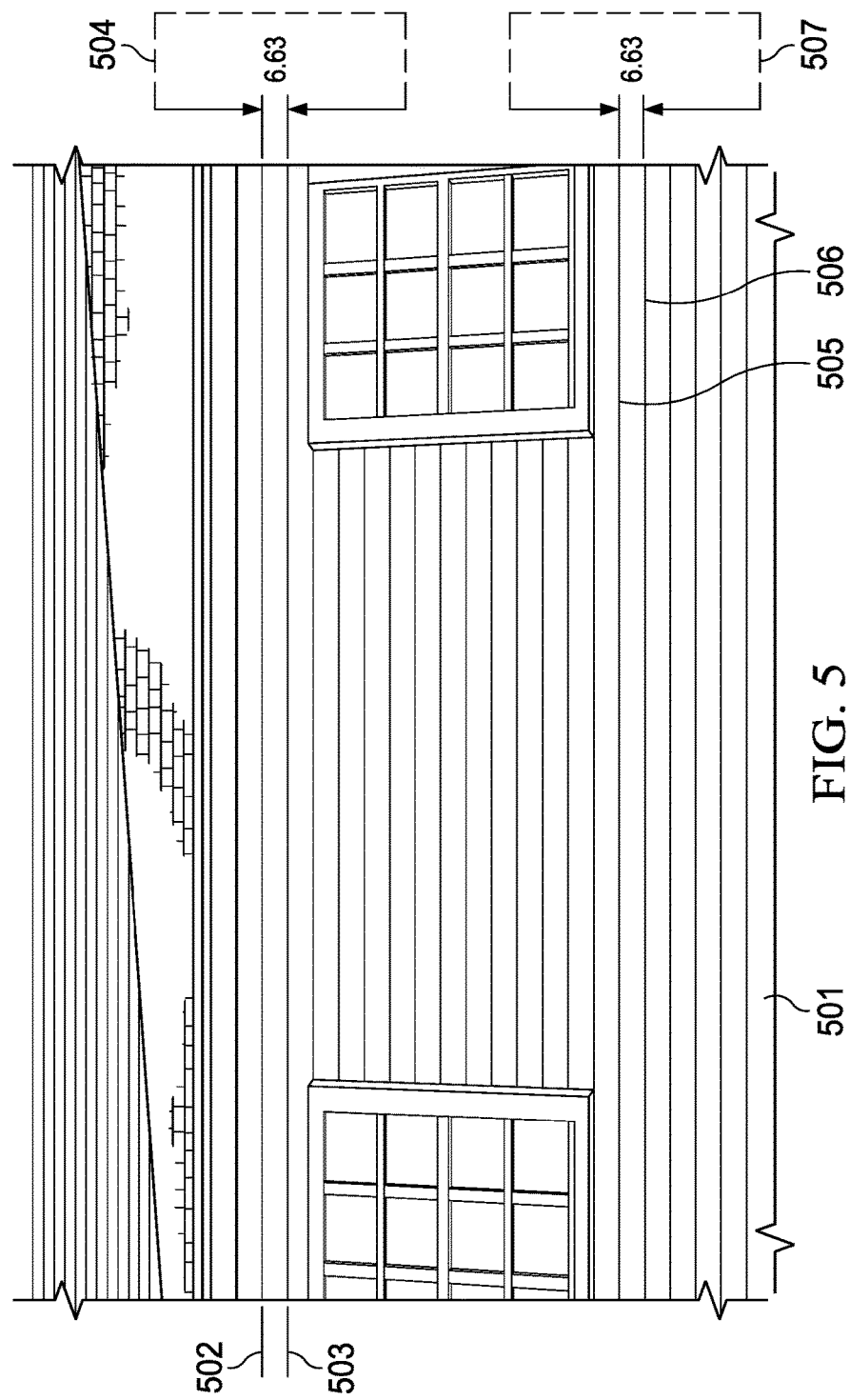
FIG. 5 illustrates an example embodiment for identifying scale/scale error in a multi-dimensional building model using siding rows as the known architectural dimension in accordance with the present disclosure.

FIG. 5 illustrates an example embodiment for identifying error in a building model using siding rows as the known architectural dimension in accordance with the present disclosure. Digital image 501 captures a building object showing a façade covered with siding. Using the techniques described previously, corresponding to the boundaries of each row of siding are determined. In one embodiment, the boundaries of the entire row (e.g., left edge of the façade to right edge of the façade) of siding are determined. In other embodiments, less than an entire row is used. Lines 502 and 503 define the upper and lower boundary of one row of siding. Measurement 504 determines the distance between the pixels defining the upper and lower boundary of the row of siding. In one embodiment, the number of pixels between the upper and lower boundary of the row of siding is determined and, based on the resolution of each pixel, a measurement (e.g., feet (f), inches (in), meters (m), centimeters (cm), etc.) can be extrapolated. In another embodiment, the boundaries of a portion of the siding row are determined. Lines 505 and 506 define the upper and lower boundaries of a portion of the row of siding. Measurement 507 determines the distance between the pixels defining the upper and lower boundaries of the row of siding. In yet another embodiment, measurements 504 and 507 are averaged to determine an average measurement of the distance between rows of siding.

In one embodiment, the camera orientation relative to the facades of the building in the image is solved using known methods. The building facade orientation information is used to skew (i.e., rectify) the digital image to appear as if it was captured from directly in front of the corresponding façade of the building. By solving for the building facade orientations and rectifying the digital image, the siding rows are parallel lines and do not converge to cause error in the average measurements across the length of the façade. In another embodiment, the digital image is a rectified digital image created during model construction and texturing.

Figure 6:
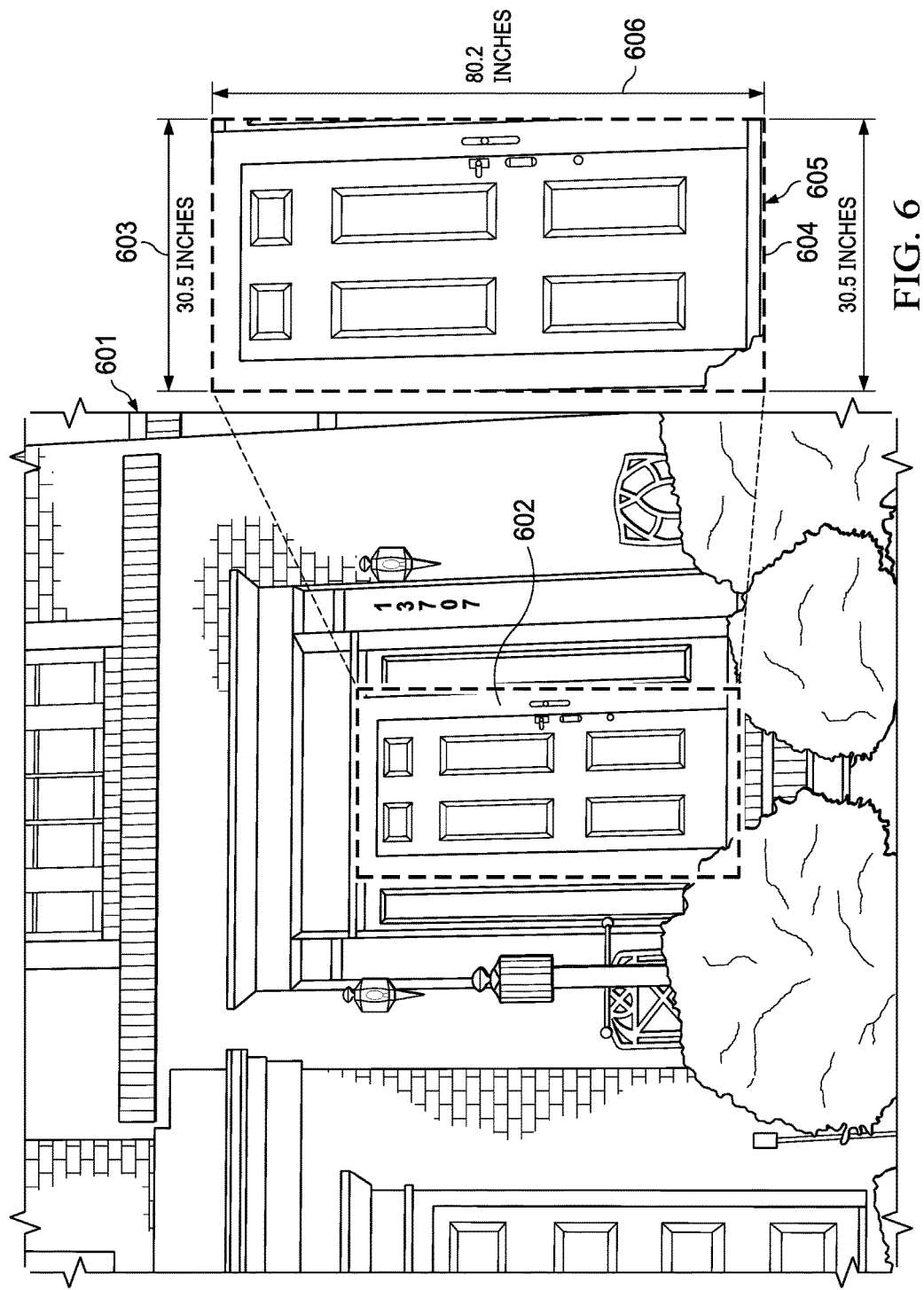
FIG. 6 illustrates an example embodiment for identifying scale/scale error in a multi-dimensional building model using a door as the known architectural dimension in accordance with the present disclosure.

FIG. 6 illustrates an example embodiment for identifying error in a building model using a door as the known architectural dimension in accordance with the present disclosure. Digital image 601 shows a front façade of a building object that includes a door. The boundaries of the known architectural feature (i.e., the door) are determined and a dimension (dimensional ratio) is extrapolated based on door 602 boundaries. The ratio between the door height and width is used to identify error and determine the actual dimensions of the door. As with the previous examples, the measurements are compared to existing known door dimensions and/or ratios, including threshold error rates, to identify a possible known architectural standards match. FIG. 6 is used for diagrammatic purposes, specific positioning and designation of dimensions may change from image-to-image and distinct architectural feature. For example, the known door architectural standard may include or not include the door frame as shown. For example, when an external storm door is also included, in some embodiments, measurements will be taken of the storm door only, the exterior door or both.

Figure 7:
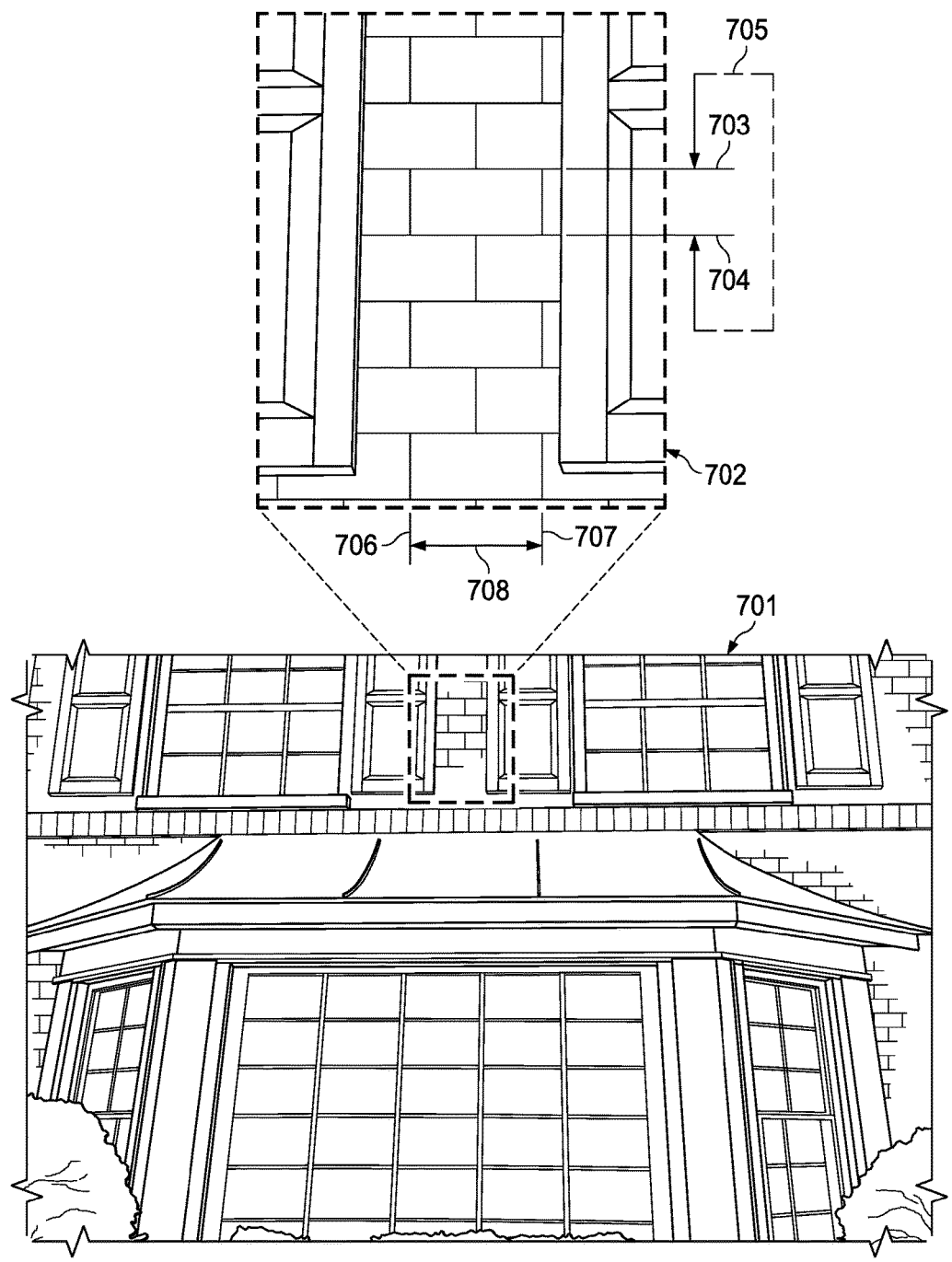
FIG. 7 illustrates yet another example embodiment for identifying scale/scale error in a multi-dimensional building model using brick layout as the known architectural dimension in accordance with the present disclosure.

FIG. 7 illustrates yet another example embodiment for identifying error in a building model using a brick layout as the known architectural dimension in accordance with the present disclosure. Digital image 701 captures a façade of a building object showing exposed brick. In one embodiment, a portion of the façade is used to establish the top and bottom boundaries of a horizontal row of brick in a similar technique to the previously discussed siding rows. Portion 702 shows an exposed brick façade with bricks in the traditional offset pattern. Top boundary 703 and bottom boundary 704 are determined for a row of bricks. Average measurement 705 is determined using the difference between the pixels corresponding to top boundary 703 and bottom boundary 704. The average measurement between top boundary 703 and bottom boundary 704 are compared to the known architectural standards for bricks dimensions (see Table 1) to determine actual dimensions. In another embodiment, the left boundary 706 and right boundary 707 of the brick are used to identify error and rescale and reconstruct the building model. Average measurement 708 is determined using the difference between the pixels corresponding to left boundary 706 and right boundary 707 and compared to the known architectural standards for brick dimensions. For greater accuracy of multiple smaller dimensioned architectural features (e.g., bricks), averaging of an error associated with a large number of the bricks will increase accuracy. As with the door example, simple ratios of width-to-height and height-to-width of the bricks are used (without a pixel analysis) to match to known architectural ratios of standard brick sizes (with or without a threshold error).

FIGS. 8A, 8B, 8C, and 8D, collectively illustrate example embodiments for identifying error in scaling of a building model using roofing elements as the known architectural dimension in accordance with the present disclosure. For example, shingles, gables, chimneys, vent pipes, dormers, skylights, solar panels, fans, gutters, fascia boards, rakes, etc. are used as known roofing elements (known architectural features).

Figure 8A:
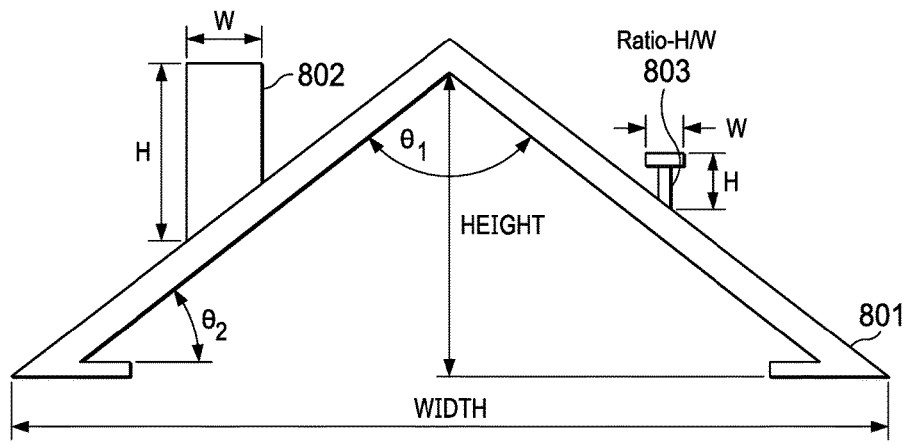
FIG. 8A-8D illustrate additional example embodiments for identifying scale/scale error in a multi-dimensional building model using roofing elements as the known architectural dimension in accordance with the present disclosure.

FIG. 8A illustrates an end view of a house with gable 801, chimney 802 and vent pipe 803. The boundaries of the known architectural features are determined and a dimension (ratio) is extrapolated based on H:W (height/width) or W:H (width/height). In alternate embodiments, angles, such as $\theta 1$ or $\theta 2$, can be used to calculate dimensional ratios using known geometric analysis techniques. In addition, multiple dimensional ratios height:width:length (H:W:L) or known dimensions such as, depth, radius, diameter, circumference, perimeter, surface area, area, etc., can be used without departing from the scope of the technology described herein. For example, the ratio between the gable height and width is used to identify scale and determine the actual dimensions of the gable using techniques in any of the various embodiments described herein. As with the previous examples, the measurements are compared to existing known gable dimensional ratios, with or without threshold error rates, to identify possible known architectural standards matches.

FIG. 8A is used for diagrammatic purposes, specific positioning and designation of dimensions may change from image-to-image and distinct architectural feature. For example, the known chimney architectural standard may include or not include an upper collar or chimney cap. For another example, when a gable is analyzed, in one example embodiment, ratio or length measurements will only be taken for one side of the gable, and because of known symmetry, be considered applicable for scaling an opposing side or positioning a supporting wall. Also, the gable can be analyzed with or without an overhang, fascia, rake, etc.

Figure 8B:
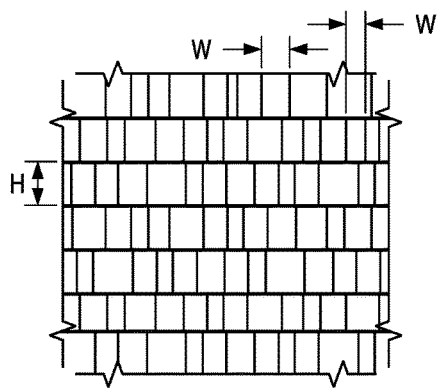
Figure 8C:
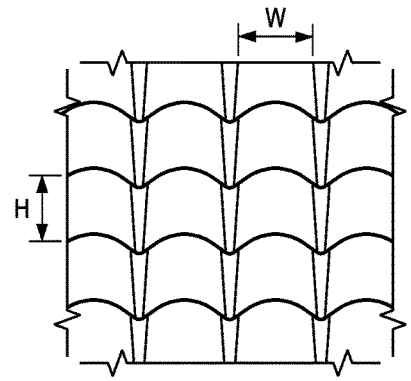
Figure 8D:
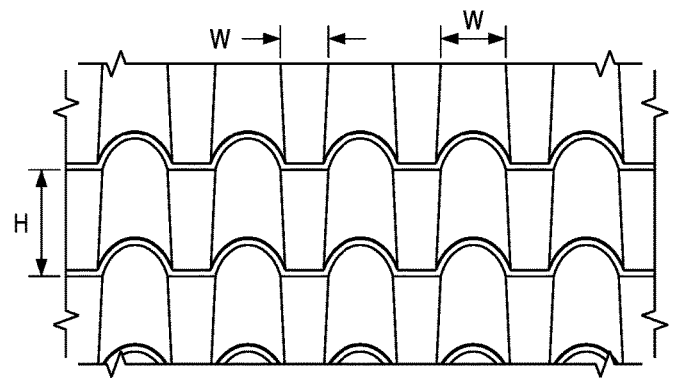

FIGS. 8B, 8C and 8D each illustrate various shingle patterns. The boundaries of the known architectural features are determined and a dimension (ratio) is extrapolated based on H:W (height/width) or W:H (width/height). In an alternate embodiment, shingle patterns can include multiple dimensional ratio analyses each covering identified unique shingle shapes within the shingle pattern. As with the previous examples, the ratios/measurements are compared to existing known shingle dimensional ratios, with or without scale error rates, to identify a possible known architectural standards match using techniques in any of the various embodiments described herein. FIGS. 8B, 8C and 8D are used for diagrammatic purposes, specific positioning, shapes, patterns, material types and designation of dimensions may change from image-to-image and with distinct architectural features.

Figure 9:
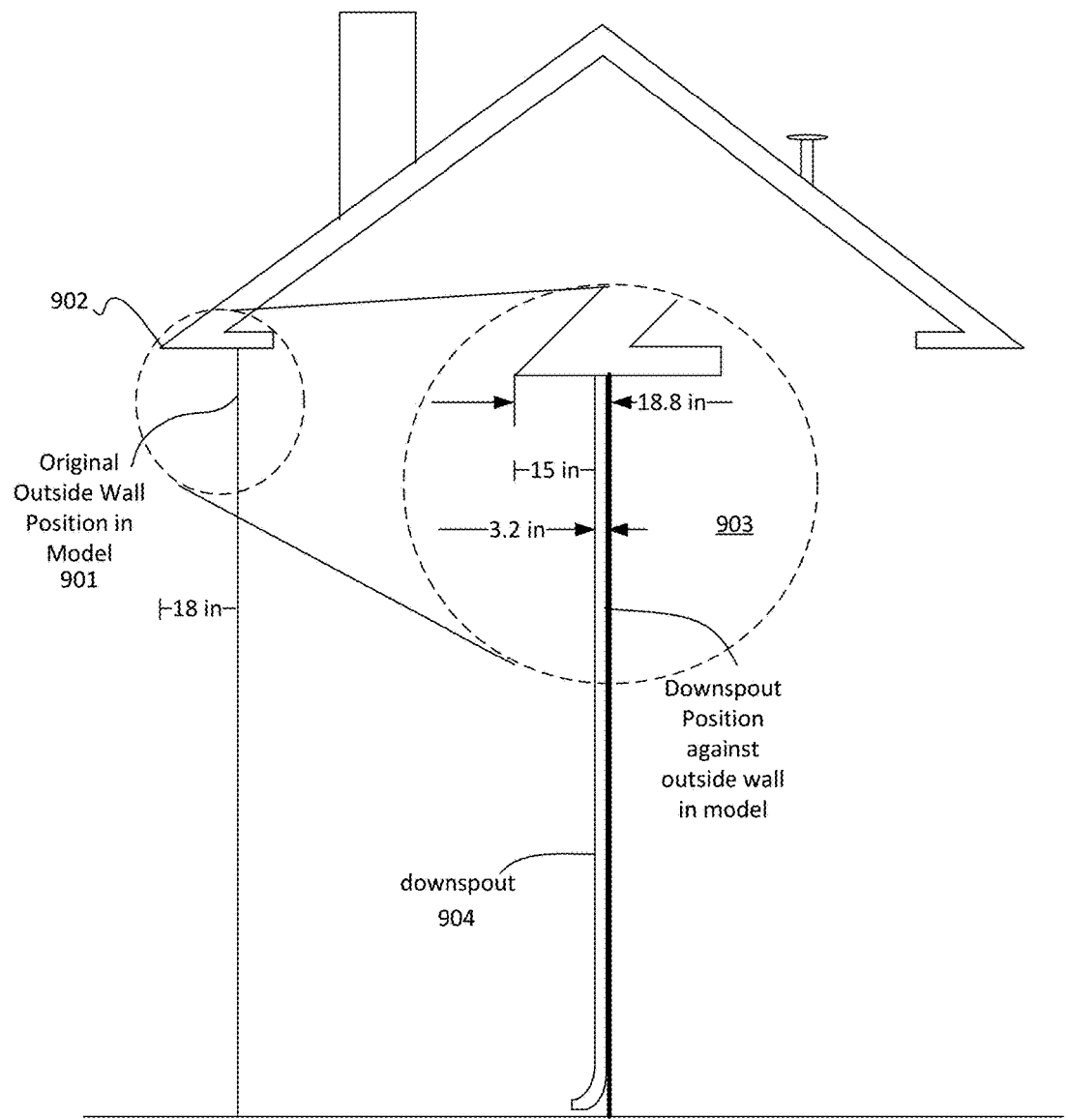
FIG. 9 illustrates yet another example embodiment for identifying scale error in a multi-dimensional building model using known positions of elements as the known architectural dimension in accordance with the present disclosure.

FIG. 9 illustrates yet another example embodiment for identifying positions, scale, or scale error in a multi-dimensional building model using identified relative positions of elements as the known architectural dimension. As previously described, if positions of key known architectural features within a multi-dimensional model can be identified, the model can be accurately dimensioned (scaled) by properly moving selected planes (e.g., walls) to correct positions, scaling or rescaling. For example, downspouts always follow an exterior wall edge. If the downspouts can be properly identified, proper placement of associated wall planes can be improved.

As shown, in an initial multi-dimensional model build, exterior wall 901 is shown at a position 18 inches inset from roof overhang outer edge 902. However, in an enlarged image of this section (903), it is shown that an inside edge, plus gap between gutter and exterior wall, of downspout 904 is actually positioned at 18.8 inches from the overhang edge. The positioning of the downspout would suggest that the original exterior wall placement was too close to the overhang edge. In a first example embodiment, without consideration of measurements, the exterior wall plane in the model is simply moved to be adjacent to downspout 904. In a second embodiment, the scale error between an accurate position measurement of 18.8 inches and the model placement of 18 inches can be used to scale/rescale the entire model. In a third embodiment, this scale error can be applied simply to the associated plane or architectural features in the plane in which the downspout was identified.

Figure 10:
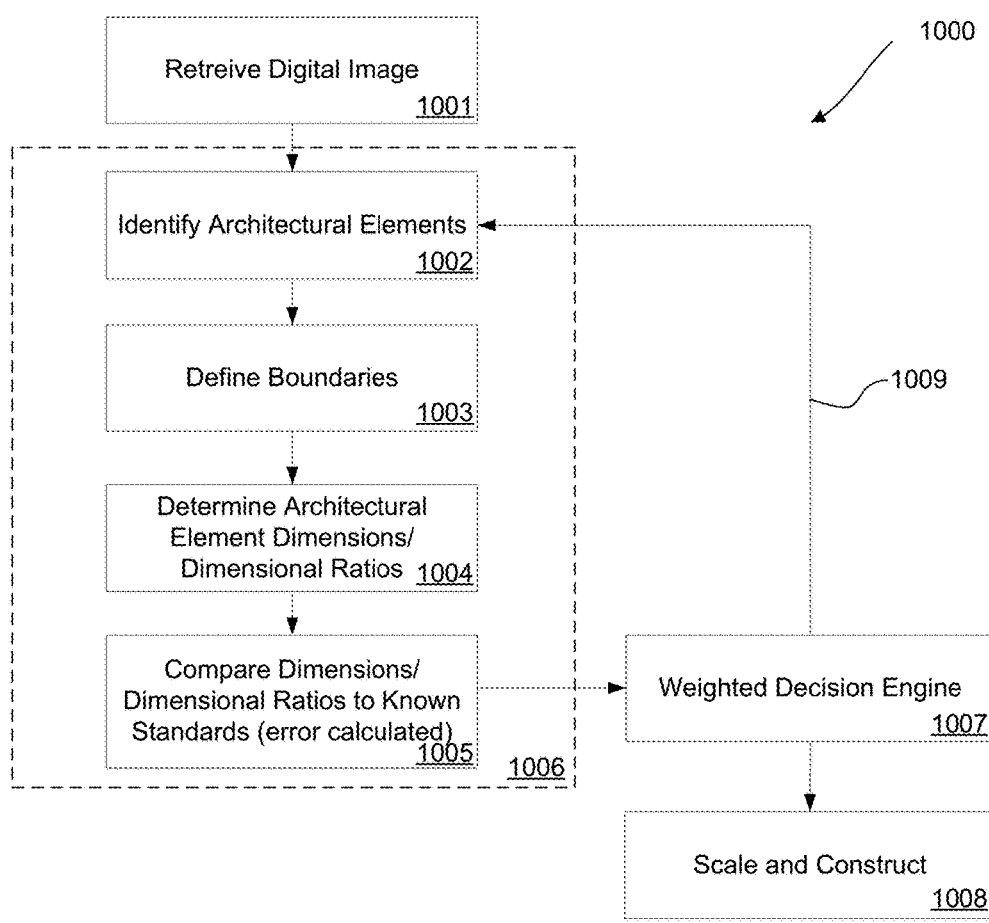
FIG. 10 illustrates an embodiment of a flowchart for improving the accuracy of the dimensions of a building model in accordance with the present disclosure.

FIG. 10 illustrates an embodiment of a flowchart for improving the accuracy of the dimensions of a building model in accordance with the present disclosure. In one embodiment, the process of identifying scale, scale error, scaling, rescaling and reconstructing is used to improve the accuracy of dimensioning a multi-dimensional building model. Process 1000 includes identification of scale errors in a multi-dimensional building model by retrieving a digital image in step 1001 that contains architectural elements (i.e., siding, brick, door, window, gables, roofing features, etc.). In step 1002, architectural elements are identified (e.g., doors). In step 1003, boundaries of the identified architectural element are defined and are used to measure the various dimensions/dimensional ratios of the architectural elements in step 1004. The measurement is compared to the known architectural element standard dimensions/dimensional ratios to determine the actual measurement in step 1005. Steps 1002 through 1005 are repeatable 1009 in an identification and measurement cycle 1006 that can be mathematically combined (e.g., averaged, mean, median, etc.) over multiple similar or dissimilar architectural features.

While siding, bricks, doors and windows can provide accurate scaling references, other objects located within the building model as well as in the foreground and background of digital images can be used to provide increased scaling accuracy. For example, some additional objects include, but are not limited to, parked automobiles, light fixtures, distance between door knob and base of doors, lamp posts, telephone poles, stop signs, play structures, tables, chairs, or lawn equipment. Specific roof features include, but are not limited to, shingles, gables, eaves, dormers, gutters, chimney structures, pipe stacks, turbine vents and skylights. In other words, any known object (with identifiable dimensions) in the foreground or background can count as a dimension reference.

In one embodiment, the repeated comparison between the measurement of multiple selections of an architectural element (e.g., siding measurements in various locations within the image) and the known architectural standard dimensions established in step 1005 is fed into a weighted decision engine in step 1007 to determine an average scaling error. The weighted decision engine in step 1007 uses learned statistical analysis to improve scaling over time and measurements. As more statistical information is accumulated (learned), the weighted decision engine creates a more predictable result. In step 1008, the building model is rescaled and reconstructed according to the decision determined by the weighted decision engine in step 1007. Alternately, deep learning systems can be substituted for the weighted decision engine without departing from the scope of the technology described herein.

Figure 11:
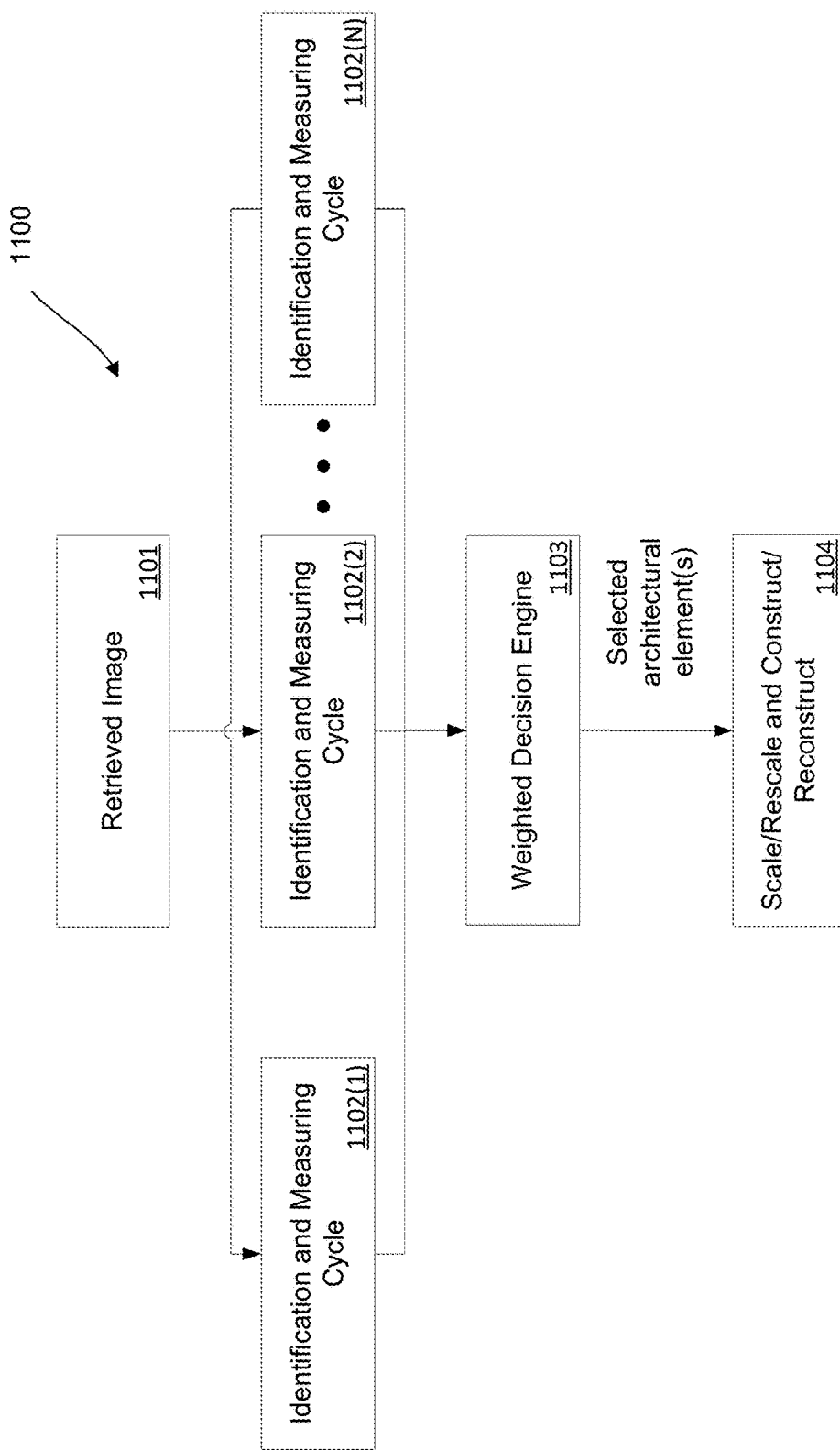
FIG. 11 illustrates an embodiment of a flowchart for weighing various known architectural elements to scale dimensions and/or adjust scale dimensions of a multi-dimensional building model in accordance with the present disclosure.

FIG. 11 illustrates an embodiment of a flowchart for weighing various known architectural elements to adjust scale in the dimensions of a building model in accordance with the present disclosure. Process 1100 includes identification of error in a multi-dimensional building model by retrieving a digital image in step 1101 that contains architectural elements. In one embodiment, the repeated identification and measurement cycle 1102 is performed (1102(1), 1102(2) . . . 1102(*n*)) for multiple architectural elements (e.g., siding (1), brick (2), door (3), etc.) identified in the digital image retrieved in step 1101. For example, if the retrieved digital image includes more than one architectural element (e.g., a brick façade also showing the front door), identification and measurement cycle 1106 (repeated for averaging) is performed for each architectural feature to determine which architectural feature(s) in weighted decision engine in step 1107 would likely provide the most accurate, rescaled building model in step 1108. For example, measuring the front door may statistically prove a better gauge of scale error (e.g., closer to actual known measurements or having a higher frequency of correlation to known dimensions over multiple cycles) than siding scale determinations.

In one embodiment, a weighted decision engine is provided to determine the architectural elements(s) that are most likely to produce an accurately scaled/rescaled and constructed/reconstructed (1104) building model based on using a least quantity of processing or providing fastest cycle times, or that prove more accurate over time. In addition, location of architectural elements may determine specific façade scaling. For example, if a door on a façade indicates an error (4% too large) and bricks on a side façade indicate an error in width (3% too narrow), the different facades could be rescaled separately.

In addition, the various embodiments may be interchangeably implemented before, during or after construction of the multi-dimensional model.

Figure 12:
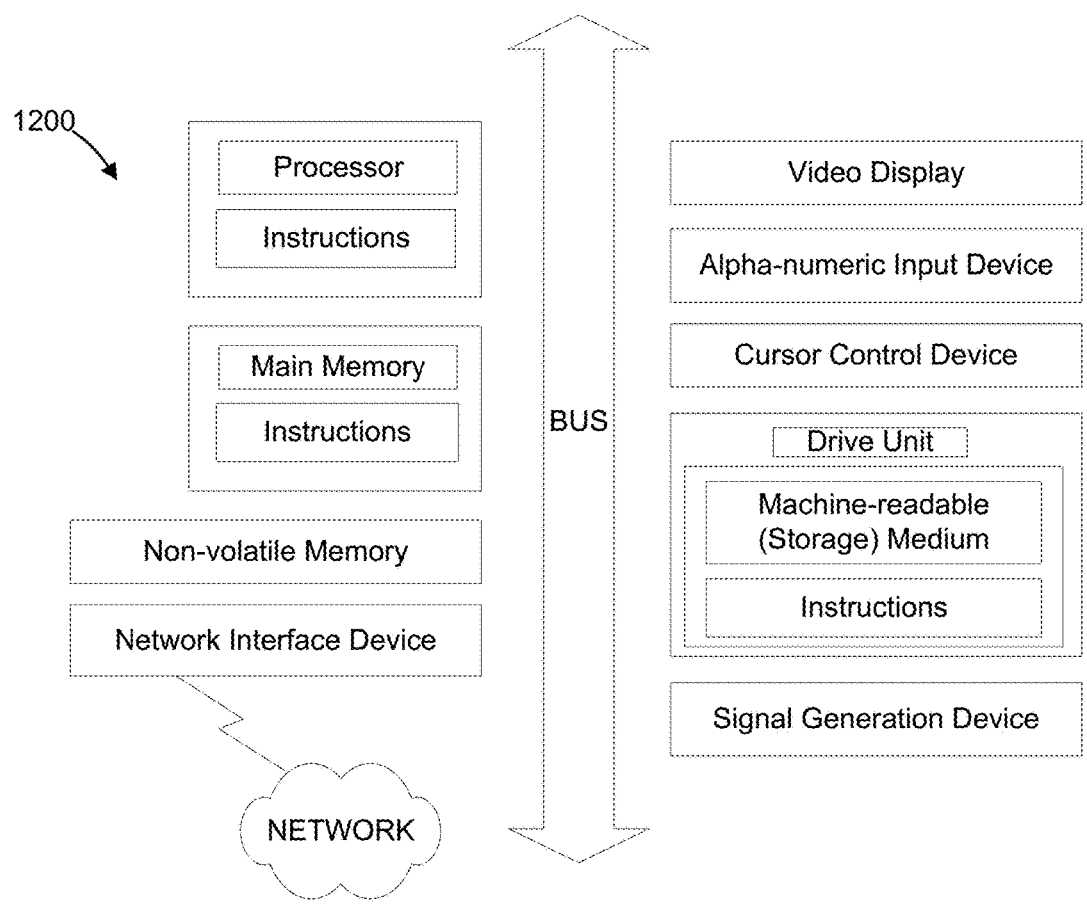
FIG. 12 illustrates a diagrammatic representation of a machine in the example form of a computer system in accordance with the present disclosure.

Referring now to FIG. 12, therein is shown a diagrammatic representation of a machine in the example form of a computer system 1200 within which a set of instructions, for causing the machine to perform any one or more of the methodologies or modules discussed herein, may be executed. Computer system 1200 includes a processor, memory, non-volatile memory, and an interface device. Various common components (e.g., cache memory) are omitted for illustrative simplicity. The computer system 1200 is intended to illustrate a hardware device on which any of the components depicted in the example of FIG. 1 (and any other components described in this specification) can be implemented. The computer system 1200 can be of any applicable known or convenient type. The components of the computer system 1200 can be coupled together via a bus or through some other known or convenient device.

This disclosure contemplates the computer system 1200 taking any suitable physical form. As example and not by way of limitation, computer system 1200 may be an embedded computer system, a system-on-chip (SOC), a single-board computer system (SBC) (such as, for example, a computer-on-module (COM) or system-on-module (SOM)), a desktop computer system, a laptop, notebook or tablet computer system, an interactive kiosk, a mainframe, a mesh of computer systems, a mobile telephone, a smartphone, a personal digital assistant (PDA), a server, or a combination of two or more of these. Where appropriate, computer system 1200 may include one or more computer systems 1200; be unitary or distributed; span multiple locations; span multiple machines; or reside in a cloud, which may include one or more cloud components in one or more networks. Where appropriate, one or more computer systems 1200 may perform without substantial spatial or temporal limitation one or more steps of one or more methods described or illustrated herein. As an example, and not by way of limitation, one or more computer systems 1200 may perform in real time or in batch mode one or more steps of one or more methods described or illustrated herein. One or more computer systems 1200 may perform at different times or at different locations one or more steps of one or more methods described or illustrated herein, where appropriate.

The processor may be, for example, a conventional microprocessor such as an Intel Pentium microprocessor or Motorola power PC microprocessor. One of skill in the relevant art will recognize that the terms "machine-readable (storage) medium" or "computer-readable (storage) medium" include any type of device that is accessible by the processor.

The memory is coupled to the processor by, for example, a bus. The memory can include, by way of example but not limitation, random access memory (RAM), such as dynamic RAM (DRAM) and static RAM (SRAM). The memory can be local, remote, or distributed.

The bus also couples the processor to the non-volatile memory and drive unit. The non-volatile memory is often a magnetic floppy or hard disk, a magnetic-optical disk, an optical disk, a read-only memory (ROM), such as a CD-ROM, EPROM, or EEPROM, a magnetic or optical card, or another form of storage for large amounts of data. Some of this data is often written, by a direct memory access process, into memory during execution of software in the computer 1200. The non-volatile storage can be local, remote, or distributed. The non-volatile memory is optional because systems can be created with all applicable data available in memory. A typical computer system will usually include at least a processor, memory, and a device (e.g., a bus) coupling the memory to the processor.

Software is typically stored in the non-volatile memory and/or the drive unit. Indeed, for large programs, it may not even be possible to store the entire program in the memory. Nevertheless, it should be understood that for software to run, if necessary, it is moved to a computer readable location appropriate for processing, and for illustrative purposes, that location is referred to as the memory in this paper. Even when software is moved to the memory for execution, the processor will typically make use of hardware registers to store values associated with the software, and local cache that, ideally, serves to speed up execution. As used herein, a software program is assumed to be stored at any known or convenient location (from non-volatile storage to hardware registers) when the software program is referred to as "implemented in a computer-readable medium." A processor is considered to be "configured to execute a program" when at least one value associated with the program is stored in a register readable by the processor.

The bus also couples the processor to the network interface device. The interface can include one or more of a modem or network interface. It will be appreciated that a modem or network interface can be considered to be part of the computer system 1200. The interface can include an analog modem, isdn modem, cable modem, token ring interface, satellite transmission interface (e.g., "direct PC"), or other interfaces for coupling a computer system to other computer systems. The interface can include one or more input and/or output devices. The I/O devices can include, by way of example but not limitation, a keyboard, a mouse or other pointing device, disk drives, printers, a scanner, and other input and/or output devices, including a display device. The display device can include, by way of example but not limitation, a cathode ray tube (CRT), liquid crystal display (LCD), or some other applicable known or convenient display device. For simplicity, it is assumed that controllers of any devices not depicted reside in the interface.

In operation, the computer system 1200 can be controlled by operating system software that includes a file management system, such as a disk operating system. One example of operating system software with associated file management system software is the family of operating systems known as Windows® from Microsoft Corporation of Redmond, Wash., and their associated file management systems. Another example of operating system software with its associated file management system software is the Linux™ operating system and its associated file management system. The file management system is typically stored in the non-volatile memory and/or drive unit and causes the processor to execute the various acts required by the operating system to input and output data and to store data in the memory, including storing files on the non-volatile memory and/or drive unit.

The technology as described herein may have also been described, at least in part, in terms of one or more embodiments. An embodiment of the technology as described herein is used herein to illustrate an aspect thereof, a feature thereof, a concept thereof, and/or an example thereof. A physical embodiment of an apparatus, an article of manufacture, a machine, and/or of a process that embodies the technology described herein may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While particular combinations of various functions and features of the technology as described herein have been expressly described herein, other combinations of these features and functions are likewise possible. For example, the steps may be completed in varied sequences to complete the textured facades. The technology as described herein is not limited by the particular examples disclosed herein and expressly incorporates these other combinations.

What is claimed is:

1. A method of correcting scale for a multi-dimensional building model comprises:
   identifying an architectural element located on a plane of the multi-dimensional building model, wherein the identified architectural element includes at least one roof element including one or more of: shingles, gables, eaves, dormers, and gutters;
   determining one or more positions of the identified architectural element;
   selecting a known relative position of a known similar architectural element, wherein the known relative position of a known similar architectural element includes construction industry standards of a predetermined architectural standard position of a known similar architectural element relative to a building plane;
   comparing the determined one or more positions of the identified architectural element to the selected known relative positions of the known similar architectural element to determine an error in position of the identified architectural element;
   determining a scale for the plane of the identified architectural element based on the error in position of the identified architectural element; and
   scaling one or more planes of the multi-dimensional building model according to the determined scale.

2. The method of claim 1, wherein the multi-dimensional building model includes any of: a two-dimensional (2D) building, a three-dimensional (3D) building or a building interior.

3. The method of claim 1 further comprises reconstructing and rescaling the multi-dimensional building model based on the determined scale.

4. The method of claim 1, wherein the multi-dimensional building model includes two or more identified architectural elements.

5. The method of claim 1, wherein the error in position includes one or more dimensional errors associated with any of: width, height, length, depth, radius, diameter, circumference, or perimeter.

6. The method of claim 1, wherein the multi-dimensional building model includes imagery rectified and correlated to vertices of geometric planes or polygons of the multi-dimensional building model.

7. A system for rescaling a multi-dimensional building model comprising:
- a multi-dimensional building model database operable to store a multi-dimensional building model; and
- a processor communicatively coupled to the multi-dimensional building model database and operable to:
- identify an architectural element located on a plane of the multi-dimensional building model;
- determine one or more positions of the identified architectural element;
- select a known relative position of a known similar architectural element, wherein the known relative position of a known similar architectural element includes construction industry standards of a predetermined architectural standard position of a known similar architectural element relative to a building plane, wherein the identified architectural element is at least a first side of a building gable and the selected known relative position of a known similar architectural element includes supporting a first plane identified as an exterior wall at a known distance from an edge of the at least a first side of a building gable;
- compare the determined one or more positions of the identified architectural element to the selected known relative positions of the known similar architectural element to determine an error in position of the identified architectural element;
- determine a scale for the plane of the identified architectural element based on the error in position of the identified architectural element; and
- scale one or more planes of the multi-dimensional building model according to the determined scale.

8. The system of claim 7 further comprises the identified architectural element also including a second side of the building gable and the selected known relative position of a known similar architectural element includes a second plane identified as an exterior wall that is symmetrically positioned with respect to the first plane and a center point of the building gable.

9. A mobile device for a multi-dimensional building model comprising:
- a display to display a multi-dimensional building model; and
- a processor communicatively coupled to a multi-dimensional building model database and operable to:
- identify an architectural element located on a plane of the multi-dimensional building model;
- determine one or more positions of the identified architectural element;
- select a known relative position of a known similar architectural element, wherein the known relative position of a known similar architectural element includes construction industry standards of a predetermined architectural standard position of a known similar architectural element relative to a building plane, wherein the identified architectural element is a downspout and the selected known relative position of a known similar architectural element includes a position adjacent to at least one plane in the multi-dimensional building model comprising an exterior wall;
- compare the determined one or more positions of the identified architectural element to the selected known relative positions of the known similar architectural element to determine an error in position of the identified architectural element;
- determine a scale for the plane of the identified architectural element based on the error in position of the identified architectural element; and
- scale one or more planes of the multi-dimensional building model according to the determined scale.

\* \* \* \* \*